United States Patent [19]

Weckler

[11] Patent Number: 4,853,964

[45] Date of Patent: Aug. 1, 1989

[54] ELECTROACOUSTIC APPARATUS FOR REPRODUCING LOWEST TO MEDIUM FREQUENCIES

[75] Inventor: Joachim Weckler, Rockenberg, Fed. Rep. of Germany

[73] Assignees: Institut Lucius, Echzell; Eric Eggebrecht, Mainz; Marcus Schulte, Griesheim; Moritz Daser, Haibach; Johannes Giessler, Mannheim; Christoph Schmitz, Bad Homburg, all of Fed. Rep. of Germany; a part interest to each

[21] Appl. No.: 142,671

[22] Filed: Jan. 7, 1988

[30] Foreign Application Priority Data

Jan. 10, 1987 [DE] Fed. Rep. of Germany ....... 3700539

[51] Int. Cl.[4] ........ H05K 5/00

[52] U.S. Cl. ........ 381/156; 181/152; 181/156; 181/159; 181/194

[58] Field of Search ........ 181/159, 152, 194; 381/99, 156

[56] References Cited

U.S. PATENT DOCUMENTS 3,432,002 3/1969 Cohen ........ 381/159
4,138,594 2/1979 Klipsch ........ 381/99
4,210,223 7/1980 Gillum et al. ........ 181/194
4,524,846 6/1985 Whitby ........ 181/159

FOREIGN PATENT DOCUMENTS 0031694 2/1983 Japan ........ 381/156

*Primary Examiner*—Jin F. Ng
*Assistant Examiner*—Mehdi Haghani
*Attorney, Agent, or Firm*—Bucknam and Archer

[57] ABSTRACT

Electroacoustic apparatus for reproducing lowest to medium frequencies being provided with a housing wherein a folded exponential horn combined with a loudspeaker is defined having five horn element walls lengthening the horn with good exponential form toward its throat and bent horn element walls provided in the area ending in the horn mouth and at foldings above the mouth and forming the horn with high approximation to an exponential function. The horn element walls are arranged so that undesired reflections are substantially avoided and no sharp break points exist in the course of the horn which is advantageously prolongated toward its throat, and a high characteristic acoustic impedance as well as a linear frequency reproduction characteristic over a wide range are achieved.

6 Claims, 2 Drawing Sheets

ELECTROACOUSTIC APPARATUS FOR REPRODUCING LOWEST TO MEDIUM FREQUENCIES

BACKGROUND OF THE INVENTION

The invention relates to an electroacoustic apparatus for the reproduction of lowest to medium frequencies and more specifically to an electroacoustic apparatus comprising a folded horn in combination with a loudspeaker, which folded horn is well approximated in its course to an ideal exponential curve.

The newest developments in CD technology, synthesizers and drum-computers require from the electroacoustic transducer technique the reproduction of the lowest or deepest sounds with relatively high sound pressure (e.g. for the church organ sounds of synthesizers or, as a specific example, the low beats of the drum in Bruckner symphonies on compact discs).

In order to achieve the reproduction of lowest to medium frequencies by an electroacoustic apparatus those apparatus have been developed having a housing wherein a cone-shaped loudspeaker combined with a folded horn is accommodated. The folding makes that the length as well as the mouth opening of the horn become large to increase the characteristic acoustic impedance to ensure, on the one hand, the transmission of the bass frequencies with high efficiency. On the other hand, the dimensions of the housing shall be limited such that an easy transport and the desired shape of a rectangular parallelepiped become possible Furthermore, it is known to give the horn an approximately exponential shape in order to increase the characteristic radiation impedance at frequencies in the 100 Hertz range, i.e. a shape where the cross section of the horn follows an exponential function When the horns are folded there are, however, a number of difficulties to achieve said approximation. Approximations have heretofore been usual by a three-stage polygonal course which resulted, however, only in an unsatisfactory approximation to the exponential function. Moreover, the folds impair the acoustic radiation characteristics due to undesired reflections.

In the horns approximated by a three-stage polygonal course three plane horn element walls are provided behind a cone-shaped loudspeaker in the upper part of the housing, which walls end in a horn throat. A bent horn element wall secured in the lower part of the housing ends in the horn mouth and defines a well-formed fold in contrast to the fold which is formed by said plane walls with the walls of the housing. A satisfactory reproduction in the range of low frequencies can, however, not be achieved with such an apparatus.

OBJECTS AND SUMMARY OF THE INVENTION

A primary object of the present invention is to provide an improved electroacoustic apparatus which transmits sounds up to less than 30 Hertz with high efficiency and a frequency characteristic as linear as possible and which also guarantees a reproduction up to about 2500 Hertz.

It is a further object of the present invention to provide an electroacoustic apparatus in which undesired reflections of the sound energy back into the space between the loudspeaker and a wall extending behind the loudspeaker are avoided by a horn element wall which more than that advantageously prolongates the horn toward its throat whereby the point of attachment of said horn element wall is overbridged by another horn element wall which advantageously stabilizes the wall construction as well as effects a good sound direction to the throat.

It is another object of the present invention to provide an electroacoustic apparatus with minor technical expenditure which has, due to its good approximation in the horn area to an ideal exponential horn shape, such a high acoustic radiation impedance that even low bass frequencies can be reproduced with good linearity in the frequency characteristic of the reproduction.

It is a further object of the present invention to achieve good sound amplifying effect by avoiding on the one hand sharp break or knee points impairing the radiation characteristics as far as possible using an exponential approximation by means of a multi-stage polygonal course comprising five plane horn element walls, and, on the other hand, by making it possible to increase the relative sizes between throat and mouth opening of the horn so that the sound is radiated in a better directed manner.

It is still another object of the present invention to provide an electroacoustic apparatus in which two foldings of the horn with a 1.5 fold unbifurcated or unforked folding are substantially reflectionless by means of the exponential-functionally bent horn element walls.

It is still a further object of the present invention to provide an electroacoustic apparatus which can be materialized with minor technical expenditure so that the whole spectre in the range between lowest and medium frequencies can be covered at reasonable cost by the apparatus according to the invention.

It is still another object of the present invention to provide an electroacoustic apparatus in which the horn is provided in the throat portion with a further horn element wall for further prolongation of the horn having a well-defined folding so that the reproduction of the low frequencies is still further improved.

It is still a further object of the present invention to provide an electroacoustic apparatus in which seven horn element walls form the horn with a good approximation to an exponential function by avoiding sharp break or knee points at their points of attachment, which exponential function is continued by semi-circular bent horn element walls.

It is another object of the present invention to provide an electroacoustic apparatus in which an additional wall is provided in the pressure chamber for a better direction of the rear sound to the horn throat, which wall also overbridges or spans the joint of the wall extending behind the loudspeaker and advantageously stabilizes this wall.

DETAILED DESCRIPTION OF THE PREFERRED EMBODIMENT

Figure 1:
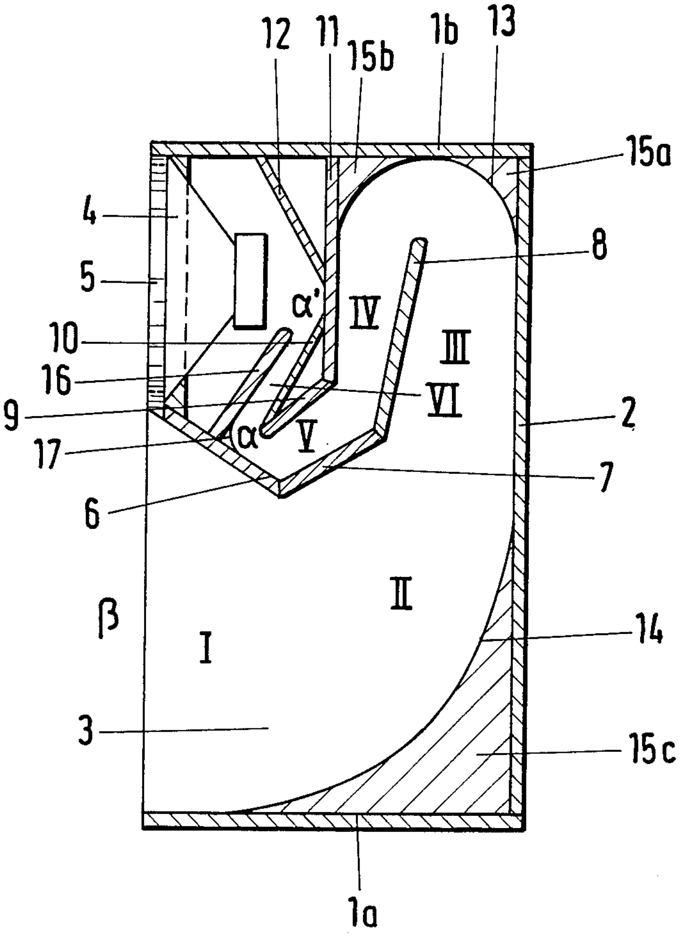
FIG. 1 is a sectional view of an embodiment of the apparatus according to the invention.

In the illustrated embodiment shown in FIG. 1 a housing having the shape of a rectangular parallelepiped is formed by rectangular bottom and cover plates 1*a*, 1*b* (width: 60 cm, and depth: 62 cm), by a rectangular rear wall 2 (width: 56 cm, height: 106 cm) and by corresponding side walls indicated by the reference numeral 3 (depth: 62 cm, height: 106 cm).

Squared timbers of a thickness of 3 cm define a frame 4 to which a plate 5 used as loudspeaker support is screwed. The square wooden frame 4 and the loudspeaker support arranged in front thereof (height: 40 cm, width: 55 cm) are mounted beneath the cover plate lb and extend parallel to the rear wall 2.

A horn combined with the loudspeaker is formed by the horn elements 6 to 17. A first inclined horn element wall 6 (length: 22 cm, width: 56 cm) joins the lower edge of the square wooden frame 4, which edge is accordingly bevelled for this purpose. This point of attachment is is placed by 3.5 cm into the interior of the housing measured from the front edge of the cover plate and is provided 44 cm beneath the cover plate. The inclination of said first wall relative to the horizontal line (or to the cover plate) is about 34° so that the distance between the lower edge of said wall 6 opposite the edge of its point of attachment and the cover plate is 53 cm.

This lower end of wall 6 is joined by a second inclined upward directed horn element wall 7 (length: 19 cm, width: 56 cm) forming an angle with the horizontal of about 30° and its highest edge being spaced 44 cm apart from the cover plate. A steep inclined third horn element wall 8 (length: 33 cm, width: 56 cm) is fixed to said highest edge and forms with the horizontal an angle of about 80°; its free upper edge is spaced 13 cm apart from the cover plate.

Fourth to eighth horn element walls are arranged in the following way: all the walls 1 to 8 having such rounded-off edges that they join together without edges projecting.

A sixth horn element wall 11 (length: 36 cm) extends from the cover plate vertically downwards and is spaced 29 cm apart from the front surface of the housing. A fourth horn element wall 9 having a length of 14 cm is joined to the lower edge of said wall 11 and inclined towards the wall 6 with its free end being still spaced 5 cm apart from said wall 6 as measured in its prolongation. In order to compensate the break or knee point between the walls 11 and 9 a fifth horn element wall 10 having a length of 19 cm is placed over said break point and attached to said walls 9 and 11 with its edges fitting said walls. The wall 11 is advantageously stabilized by the walls 9 and 10 so that supplementary reinforcement members for wall 11 are not necessary. Furthermore, the wall 9 makes it possible to shorten wall 11, as it prolongates the horn to its throat and the mouth opening can advantageously be increased with regard to the small throat opening of the horn.

Said wall 10 and an additional seventh horn element wall 12 effect a good direction or deflection of the rear sound components to the horn throat α. For this purpose, the wall 12 (length: 22 cm) is also fixed to the wall 11 about in the middle of the wall 11 (20 cm below the cover plate) and is inclined upwards about mirror symmetrically relative to the wall 10 and its upper edge is secured to the cover plate 1*b*. This fixation of the upper edge of the wall 12 is spaced 18 cm apart from the front surface of the housing.

The side of the wall 11 averted from the loudspeaker is joined by a first concave, substantially semi-circular arched wall 13 adapted to an exponential function with greatest approximation, which wall 13 contacts with its arch the cover plate 1*b* and with its end the upper part of the rear wall 2. Somewhat below said latter point of contact a second concave arched wall 14 is fastened which ends in the front area of the bottom plate 1*a* also with the largest possible exponential function approximation and bridges or spans the corner formed by rear wall and the bottom plate. In order to counteract reliably vibrations of the walls 13 and 14 made of plywood, diagonal reinforcement members 15*a*, 15*b*, 15*c* adapted to the arched walls and filling the corners formed by the walls 13 and 14, by the cover plate 1*b* and the wall 11, by the cover plate and the rear wall, and by the rear wall and the bottom plate, respectively, are provided in the form of strengthening spar elements.

In order to still more prolongate and extend the horn length and to improve the approximation to the exponential curve an eighth horn element wall 16 is provided which causes an increase of the acoustic radiation impedance and further improves the reproduction of the low frequencies. The horn throat is shifted by said wall 16 to a place α'. The wall 16 (length: 10 cm) is secured to the wall 6 forming therewith an approximately right angle and being spaced 12 cm apart from the joint between the walls 7 and 6, and its free upper end is spaced 2.7 cm apart from the wall 10. A concave corner ledge or fillet 17 provided at the point of attachment of the wall 16 spans the angle between the walls 16 and 6 opposite the wall 9 and stabilizes also advantageously the wall 16.

Furthermore, edge filling elements 18 and 19 are provided in order to stabilize as well as to span the points of attachment between walls 6, 7 and 9 and for further improvement of the exponential approximation.

The exponential horn described has a large mouth opening β favoring the bass frequency transmission. Without the wall 16 the horn has a 1.5 fold unbifurcated folding (0.5 fold with 90° change of direction at 14, and 1-fold with 180° change of direction at 13). Due to the wall 16 there is an additional 180° change of direction and there is provided a 2.5 fold unbifurcated folding. All foldings are exactly formed and adapted to the aspired exponential function by the elements 13, 14, 17, 18 and 19 so that sound direction or deflection and characteristic acoustic radiation impedance are optimal. The exponential function is also very well approximated by a five-stage polygonal course (I to V) also without the wall 16 and reaches a still better approximation by a further polygonal course VI.

The embodiment described has been materialized by pressboard. Alternative materials to be used may be multiple glued plywood, wood core plywood, plywood boards, etc. as well as suitable plastic materials such as polyvinylchloride resin (PVC resin), etc.

The individual elements of the loudspeaker box are joined by gluing and screwing. Other possibilities of joining may be: groove-and-tongue or dowels.

Figure 2:
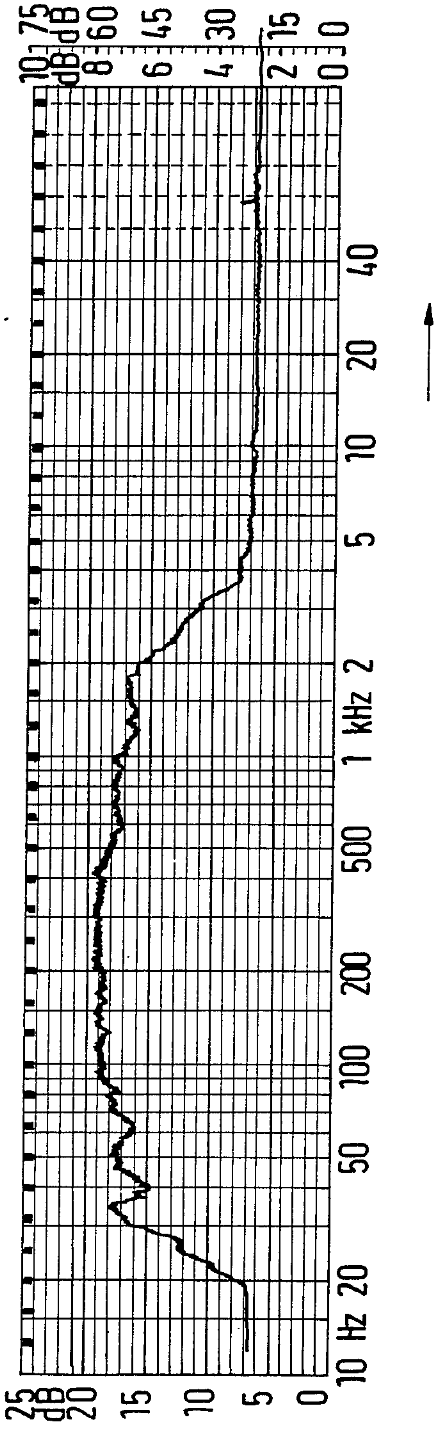
FIG. 2 shows the transmission frequency characteristic of said apparatus.

The swept frequency characteristic of the measured sound pressure illustrated in FIG. 2 shows that a linear transmission behaviour of about 2000 Hertz down to 30 Hertz results from said good exponential approximation and from the resulting high acoustic radiation impedance. In an apparatus on the market having an exponential approximation by a three-stage polygonal course and not having the described thoroughly performed foldings a sound pressure has been measured between 30 and 70 Hertz under otherwise the same conditions (unswept) which pressure is lower on an average of 5 dB than the sound pressure measured with the apparatus according to the invention. That means that the apparatus between 30 and 70 Hertz available on the market must be operated with more than three times the power on the average to achieve the same sound pressure.

The embodiment specified is designed for a 15-inch loudspeaker, and the horn shown has a lower limiting frequency of 38 Hertz. The frequency characteristic is, as shown in FIG. 2, very balanced, since the higher frequencies are transmitted no longer by the horn but by the loudspeaker up to 2 kilohertz with good linearity. By the use of a coaxial loudspeaker the transmission range may be enlarged towards high frequencies also up to the limit of audibility. In spite of the large length of the horn the housing of the apparatus specified is only medium-sized.

By changing the dimensionings 18-, 12- as well as 10-inches loudspeakers of different diameter can be materialized selectively for inward and outward mounting as well as with horns of different lower limiting frequencies.

Having thus described the preferred embodiment of the invention, it should be understood that numerous structural modifications and adaptations may be resorted to without departing from the spirit of the invention.

I claim:

1. An electroacoustic apparatus for reproducing lowest to medium frequencies comprising: a housing having an upper cover (1*b*), a bottom (1*a*), a rear side (2), a front side and two sides (3), a loudspeaker mounted on said housing beneath said upper cover on a support in front of said housing, a folded horn combined with the loudspeaker, said horn being placed in said housing and being provided with four plane horn walls for approximation to an ideal exponential horn curve by means of a mutli-stage polygonal course, the first horn wall (11) extending from said upper cover substantially parallel to the front side of said housing and spaced therefrom, a second horn wall (6) extending beneath the loudspeaker from said support and downwardly inclined, a third upwardly inclined horn wall (7) joined to said second horn wall, a fourth horn wall (8) joined to said third horn wall and extending below and behind said first horn wall, a fifth horn wall (9) connected to said first horn wall at one end and inclined towards said second horn wall, whereby said horn is prolonged towards said second horn wall wherein said horn has a throat and sound energy supplied by way of the horn throat and defined between said fifth and second horn walls is prevented from being reflected into the space between said loudspeaker and said first horn wall.

2. The electroacoustic apparatus as recited in claim 1 wherein a break point is formed between said first wall (11) and said fifth wall (9), a sixth horn wall (10) attached to said first and fifth horn walls, respectively spans said break point between said first horn wall and said fifth horn wall so that the sound is well directed to said horn throat.

3. The electroacoustic apparatus as recited in claim 2 wherein a break point is formed between said first horn wall and said upper cover, a seventh horn wall (12) spans said break point formed by the first horn wall (11) and the upper cover (1*b*) of the housing so that the sound is well directed to the horn throat.

4. The electroacoustic apparatus as recited in claim 2 wherein a seventh horn wall (12) attached to said upper cover is arranged near said horn throat for further prolongation of the horn and shifts said throat toward the point of attachment of said sixth and first horn walls so that said seventh wall defines with said sixth wall an extended horn area, and wherein a shaped corner fillet spans the break point defined by the point of attachment of said seventh wall to said upper cover whereby a folding is formed having a good approximation to exponential function.

5. The electroacoustic apparatus as recited in claim 3 in which the second, the third, and the fourth horn walls in combination with the first, the fifth, the sixth and the seventh horn walls form the horn with a good approximation to an exponential function by avoiding sharp break points, which exponential function is continued behind the first horn wall by semi-circular bent horn walls.

6. The apparatus according to claim 3 wherein an eighth wall (16) extends upwardly at a right angle from said second wall.

* * * * *